US010734434B2

(12) United States Patent
Zheng et al.

(10) Patent No.: US 10,734,434 B2
(45) Date of Patent: Aug. 4, 2020

(54) VERTICAL OVERFLOW DRAIN COMBINED WITH VERTICAL TRANSISTOR

(71) Applicant: OmniVision Technologies, Inc., Santa Clara, CA (US)

(72) Inventors: Yuanwei Zheng, San Jose, CA (US); Gang Chen, San Jose, CA (US); Duli Mao, Sunnyvale, CA (US); Dyson Tai, San Jose, CA (US); Lindsay Grant, Los Gatos, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 0 days.

(21) Appl. No.: 15/984,136

(22) Filed: May 18, 2018

(65) Prior Publication Data

US 2019/0355778 A1 Nov. 21, 2019

(51) Int. Cl.
*H01L 27/146* (2006.01)
*H04N 5/359* (2011.01)
*H04N 5/378* (2011.01)

(52) U.S. Cl.
CPC .... *H01L 27/14656* (2013.01); *H01L 27/1461* (2013.01); *H01L 27/1464* (2013.01); *H01L 27/14603* (2013.01); *H01L 27/14614* (2013.01); *H04N 5/3591* (2013.01); *H04N 5/378* (2013.01)

(58) Field of Classification Search
CPC ................................................ H01L 27/14656
See application file for complete search history.

(56) References Cited

U.S. PATENT DOCUMENTS

| 2009/0303371 | A1* | 12/2009 | Watanabe | ......... H01L 27/14603 348/311 |
| 2011/0101201 | A1* | 5/2011 | Venezia | ............ H01L 27/14627 250/200 |
| 2012/0242875 | A1* | 9/2012 | Nakamura | ........ H01L 27/14607 348/294 |
| 2016/0351606 | A1* | 12/2016 | Azami | ................ H01L 27/1461 |

FOREIGN PATENT DOCUMENTS

TW  201511243 A  3/2015

OTHER PUBLICATIONS

Search Report, dated Mar. 17, 2020, issued in corresponding Taiwanese Patent Application No. 108115977, 12 pages.

\* cited by examiner

*Primary Examiner* — Michelle Mandala
*Assistant Examiner* — Jordan M Klein
(74) *Attorney, Agent, or Firm* — Christensen O'Connor Johnson Kindness PLLC

(57) ABSTRACT

An image sensor pixel includes a photodiode disposed in a semiconductor material to generate image charge in response to light incident on a backside of the semiconductor material, and a pinning layer disposed in the semiconducting material and coupled to the photodiode. The pixel also includes a vertical overflow drain disposed in the semiconductor material and coupled to the pinning layer such that the pinning layer is disposed between the vertical overflow drain and the photodiode. A floating diffusion disposed in the semiconductor material proximate to the photodiode, and a vertical transfer transistor is disposed in part in the semiconductor material and coupled to the photodiode to transfer the image charge from the photodiode to the floating diffusion in response to a transfer signal applied to the gate terminal of the vertical transfer transistor.

22 Claims, 3 Drawing Sheets

VERTICAL OVERFLOW DRAIN COMBINED WITH VERTICAL TRANSISTOR

TECHNICAL FIELD

This disclosure relates generally to image sensors, and in particular but not exclusively, relates to CMOS image sensors.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

The typical image sensor operates as follows. Image light from an external scene is incident on the image sensor. The image sensor includes a plurality of photosensitive elements such that each photosensitive element absorbs a portion of incident image light. Photosensitive elements included in the image sensor, such as photodiodes, each generate image charge upon absorption of the image light. The amount of image charge generated is proportional to the intensity of the image light. The generated image charge may be used to produce an image representing the external scene.

Electrical crosstalk (e.g., electrons undesirably flowing between pixels) is still a major problem for image sensor technologies. Accordingly, device architectures that reduce or eliminate crosstalk may be highly desirable.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
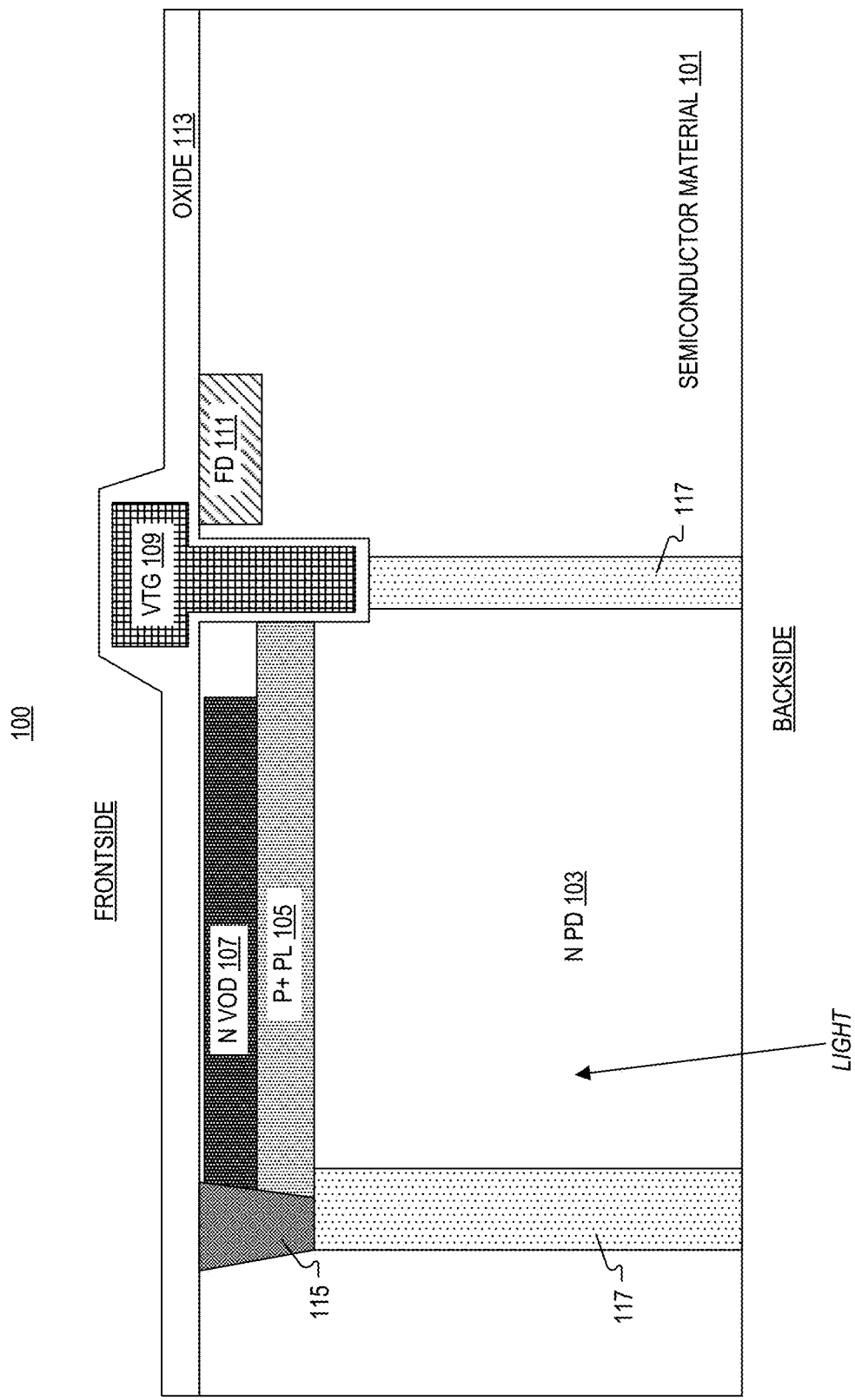
FIG. 1 depicts a cross section of an image sensor pixel, in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of apparatus and system relating to a vertical overflow drain combined with a vertical transistor are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

The instant disclosure applies a vertical overflow drain (VOD) to a backside illuminated (B SI) image sensor, together with a "buried" photo diode (e.g., having a shallow implant that force the charge carriers away from surface traps) and vertical transfer transistor. Generally this structure achieves better BSI image sensor performance metrics including less blooming, less electrical crosstalk, improved global reset, and reduced pulse time.

FIG. 1 depicts a cross section of an image sensor pixel 100, in accordance with the teachings of the present disclosure. As shown, image sensor pixel 100 includes semiconductor material 101, photodiode 103, pinning layer 105, vertical overflow drain 107, vertical transfer transistor 109, floating diffusion 111, gate oxide 113, shallow trench isolation structures 115, and deep isolation wells 117 (e.g., a P-type isolation "iso" well).

As shown, buried photodiode 103 is disposed in semiconductor material 101 to generate image charge in response to light incident on a backside of semiconductor material 101. Pinning layer 105 is disposed in semiconducting material 101 proximate to the frontside, and is coupled to photodiode 103. Vertical overflow drain 107 is disposed in semiconductor material 101, and coupled to pinning layer 105 such that pinning layer 105 is disposed between vertical overflow drain 107 and photodiode 103. Floating diffusion 111 is disposed in semiconductor material 101 proximate to photodiode 103. Vertical transfer transistor 109 is disposed in part in semiconductor material 101, and is coupled to photodiode 103 to transfer the image charge from photodiode 103 into floating diffusion 111 in response to a transfer signal applied to the gate terminal of vertical transfer transistor 109. Moreover, photodiode 103 may include a first majority charge carrier type (e.g., n-type), pinning layer 105 may include a second majority charge carrier type (e.g., p-type), and vertical overflow drain 107 may include the first majority charge carrier type (e.g., n-type). As shown, pinning layer 105 is stacked above photodiode 103, and is in contact with photodiode 103, and vertical overflow drain 107 is stacked above pinning layer 105, and is in contact with pinning layer 105. In the depicted example, the lateral bounds of vertical overflow drain 107 extend from shallow trench isolation structure 115 partially towards vertical transfer transistor 109, whereas the lateral bounds of pinning layer 105 extend from shallow trench isolation structure 115 to gate oxide 113 (which is buried in semiconductor material 101, and surrounds the gate electrode of vertical transfer transistor 109).

In some examples, vertical overflow drain 107 is coupled to photodiode 103 to prevent photodiode 103 from becoming oversaturated with image charge. Since image charge flows from photodiode 103, to pinning layer 105, to vertical overflow drain 107, extra image charge that would result in "whiteout" of pixel 100 is transferred to vertical overflow drain 107. Accordingly, a meaningful/usable image signal can still be read out of photodiode 103, even if photodiode 103 receives too much light. In some examples, vertical overflow drain 107 may be coupled to ground in order to remove the extra image charge. In some examples, vertical overflow drain 107 may be coupled to a variable voltage source to selectively remove excess charge, and control the saturation level of pixel 100.

In the illustrated example, gate oxide 113 is disposed on the frontside, opposite the backside, of semiconductor material 101. It is appreciated that the "frontside" is generally the side of the wafer/chip with the most circuitry. (late oxide 113 (e.g., silicon oxide, hafnium oxide, or the like) extends into semiconductor material 101 so that gate oxide 113 is disposed between semiconductor material 101 and the portion of vertical transfer transistor 109 that extends into semiconductor material 101. As shown, vertical overflow drain 107 is disposed between gate oxide 113 and pinning layer 105. As illustrated, vertical transfer transistor 109 extends into the frontside of semiconductor material 101, and the gate terminal of vertical transfer transistor 109 is substantially "T"-shaped. Floating diffusion 111 is disposed at least in part underneath the horizontal portion of the "T" In some examples, a trench may be etched in semiconductor material 101 to form vertical transfer transistor 109. Then the trench may be oxidized (to form a gate dielectric), and then a conductive material is deposited in the trench to form the gate electrode. The gate terminal of vertical transfer transistor 109 may include doped polycrystalline silicon or the like. In the depicted example, the vertical portion of vertical transfer transistor 109 extends into semiconductor material 101 a depth that is greater than the depth of pinning layer 105 and vertical overflow drain 107 combined. The vertical portion of vertical transfer transistor 109 contacts both pinning layer 105 and photodiode 103.

As illustrated shallow trench isolation structure 115 extends into the frontside of semiconductor material 101, and surrounds photodiode 103 at least in part. The cross section of shallow trench isolation structure 115 may be substantially trapezoidal and taper as it extends into semiconductor material 101. In the depicted example, shallow trench isolation structure 115 includes a trench in semiconductor material 101 and is at least partially filled with an oxide. Shallow trench isolation structure 115 may also include metals (e.g., metal core surrounded by oxide so that the oxide is disposed between the metal and semiconductor material 101), and as shown, shallow trench isolation structure 115 is in contact with both pinning layer 105 and vertical overflow drain 107. As shown, P-iso wells 117 extends from shallow trench isolation structure 115, and gate electrode of vertical transfer gate 109, to the backside of semiconductor material 101. Put another way shallow trench isolation structure 115 and deep P-iso wells 117 are in contact and vertically aligned in semiconductor material 101. Deep P-iso wells 117 may include a doped region of semiconductor material 101. In one embodiment, deep P-iso wells 117 are connected to P+ pinning layer 105 so they are electrically grounded together.

Figure 2:
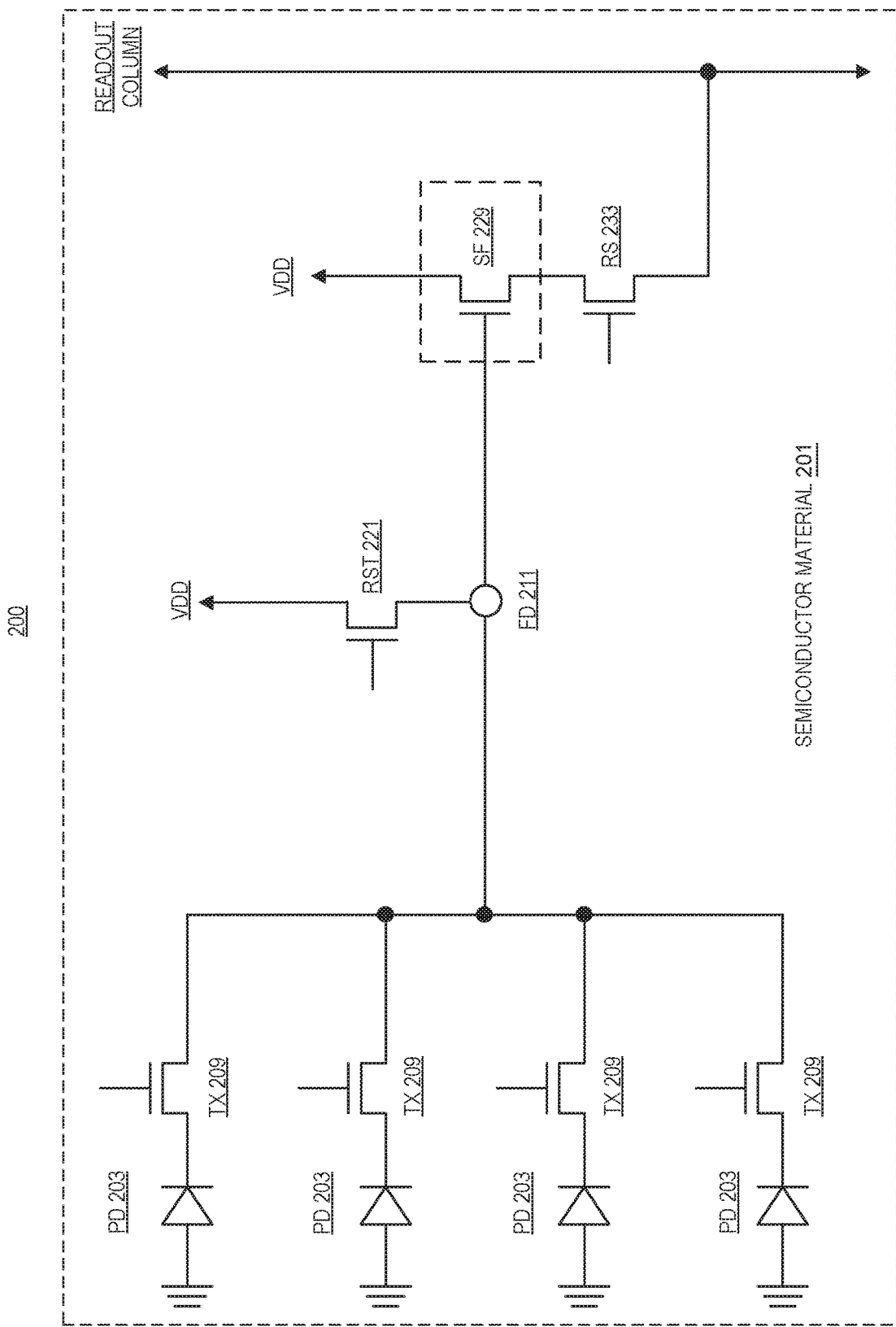
FIG. 2 depicts a circuit diagram which may include the image sensor pixel of FIG. 1, in accordance with the teachings of the present disclosure.

FIG. 2 depicts an example four-transistor (4T) pixel architecture 200 for use in an image sensor, which may contain the pixel of FIG. 1, in accordance with the teachings of the present disclosure. 4T pixel architecture 200 includes photodiodes 203, transfer transistors 209, floating diffusion 211, reset transistor 221, source follower transistor 229, and row select transistor 233. It is appreciated that for a true 4T pixel architecture, only one photodiode 203 and one transfer transistor 209 are needed; however, depicted here is a four-photodiode variant.

In the depicted example, a plurality of photodiodes 203 is disposed in semiconductor material 201 (e.g., silicon) to generate image charge in response to incident light, and floating diffusion 211 is also disposed in semiconductor material 201 proximate to photodiodes 203. Transfer transistors 209 are coupled to photodiodes 203 to transfer the image charge from photodiodes 203 into floating diffusion 211 in response to a transfer signal applied to transfer gates of transfer transistors 209. Transfer transistors 209 may be turned on in sequence to transfer charge from photodiodes 203 to floating diffusion 211 one at a time. The gate electrode of source follower transistor 229 is coupled to floating diffusion 211 to amplify a charge on floating diffusion 211. Reset transistor 221 is coupled to floating diffusion 211 to reset image charge in floating diffusion 211 (in response to a reset signal applied to the gate electrode), and row select transistor 233 is coupled to source follower transistor 229 to output the image signal.

In the depicted example, there are four photodiodes 203 and four transfer transistors 209. However, in other examples there may be any number of photodiodes 203 and transfer transistors 209 per floating diffusion 211 including, one, two, three, five, or six. Moreover, one of ordinary skill in the art having the benefit of the present disclosure will appreciate that 4T pixel architecture 200 depicted here may be repeated any number of times to form an image sensor.

Figure 3:
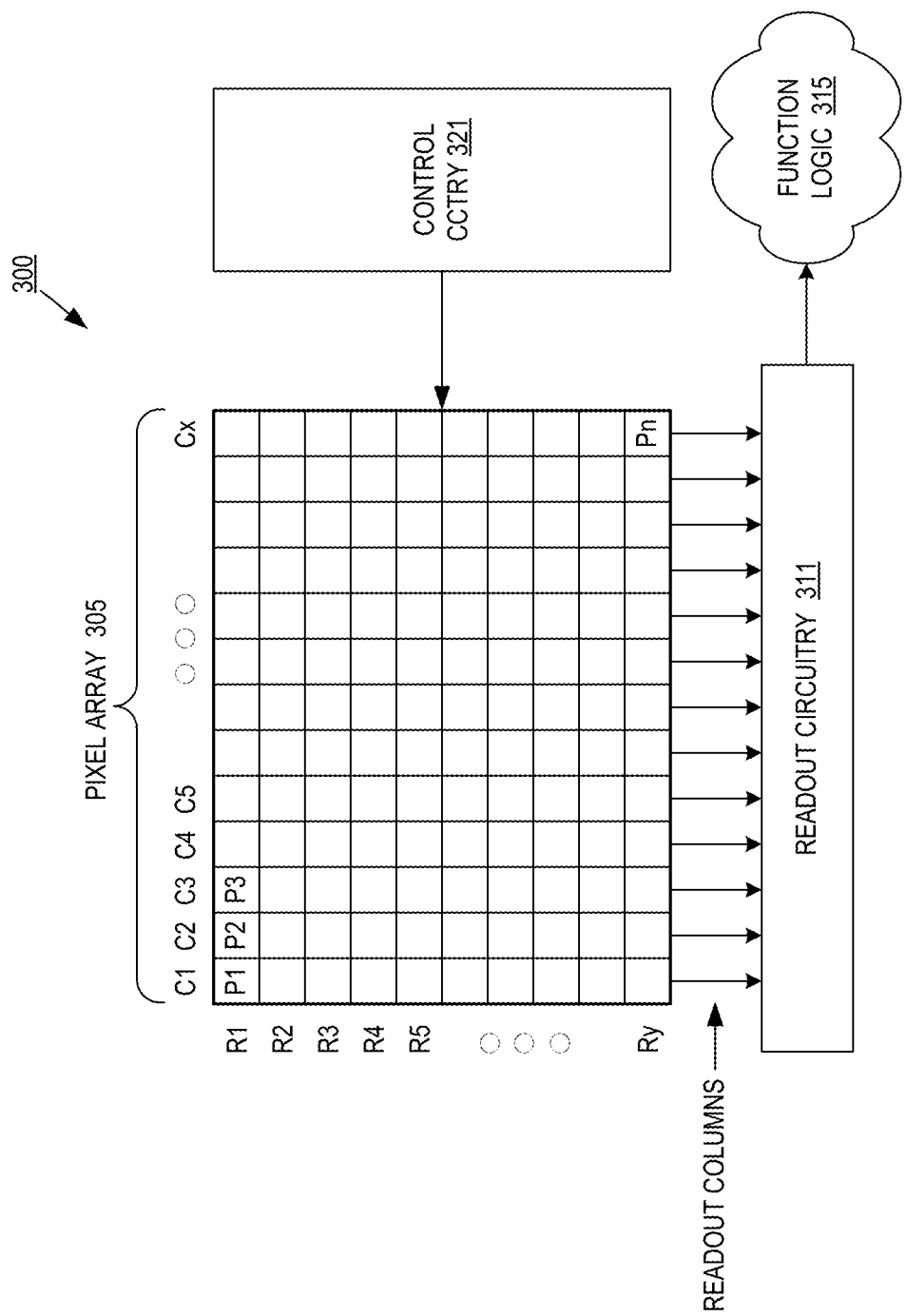
FIG. 3 illustrates a block diagram of one example of an imaging system which may include aspects of FIGS. 1 & 2, in accordance with the teachings of the present disclosure.

FIG. 3 illustrates a block diagram of one example of an imaging system 300 which may include aspects of FIGS. 1 & 2, in accordance with the teachings of the present disclosure. Imaging system 300 includes pixel array 305, control circuitry 321, readout circuitry 311, and function logic 315. In one example, pixel array 305 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 305 has acquired its image data or image charge, the image data is readout by readout circuitry 311 and then transferred to function logic 315. In various examples, readout circuitry 311 may include amplification circuitry, analog-to-digital (ADC) conversion circuitry, or otherwise. Function logic 315 may simply store the image data or even manipulate the image data by applying post image effects (e.g., autofocus, crop, rotate, remove red eye, adjust brightness, adjust contrast, or otherwise). In one example, readout circuitry 311 may readout a row of image data at a time along readout column lines (illustrated) or may readout the image data using a variety of other techniques (not illustrated), such as a serial readout or a full parallel readout of all pixels simultaneously.

In one example, control circuitry 321 is coupled to pixel array 305 to control operation of the plurality of photodiodes in pixel array 305. For example, control circuitry 321 may generate a shutter signal for controlling image acquisition. In the depicted example, the shutter signal is a rolling shutter signal. In another example, image acquisition is synchronized with lighting effects such as a flash.

In one example, imaging system 300 may be included in a digital camera, cell phone, laptop computer, automobile or the like. Additionally, imaging system 300 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 300, extract image data from imaging system 300, or manipulate image data supplied by imaging system 300.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor pixel, comprising:
   a photodiode disposed in a semiconductor material to generate image charge in response to light incident on a backside of the semiconductor material;
   a pinning layer disposed in the semiconducting material and coupled to the photodiode;
   a vertical overflow drain disposed in the semiconductor material between a front side of the semiconductor material and the pinning layer, wherein the vertical overflow drain is in contact with the pinning layer and coupled to the pinning layer such that the pinning layer is disposed between the vertical overflow drain and the photodiode;
   a floating diffusion disposed in the semiconductor material proximate to the photodiode;
   a vertical transfer transistor disposed in part in the semiconductor material and coupled to the photodiode to transfer the image charge from the photodiode to the floating diffusion in response to a transfer signal applied to a gate terminal of the vertical transfer transistor; and
   wherein first lateral bounds of the vertical overflow drain is less than second lateral bounds of the pinning layer to separate the photodiode from the vertical overflow drain.

2. The image sensor pixel of claim 1, further comprising a gate oxide disposed on a frontside, opposite the backside, of the semiconductor material, and extending into the semiconductor material so that the gate oxide is disposed between the semiconductor material and a portion of the vertical transfer transistor that extends into the semiconductor material.

3. The image sensor pixel of claim 2, wherein the vertical transfer transistor extends into the frontside of the semiconductor material.

4. The image sensor pixel of claim 3, further comprising a shallow trench isolation structure extending into the frontside of the semiconductor material and surrounding the photodiode at least in part.

5. The image sensor pixel of claim 4, wherein the shallow trench isolation structure includes a trench in the semiconductor material at least partially filled with an oxide.

6. The image sensor pixel of claim 4, further comprising a deep isolation well extending from the shallow trench isolation structure to the backside of the semiconductor material.

7. The image sensor pixel of claim 6, wherein the deep isolation well includes a doped region of the semiconductor material.

8. The image sensor pixel of claim 1, wherein the gate terminal of the vertical transfer transistor is substantially "T"-shaped.

9. The image sensor pixel of claim 1, wherein the photodiode includes a first majority charge carrier type, the pinning layer includes a second majority charge carrier type, and the vertical overflow drain includes the first majority charge carrier type.

10. The image sensor pixel of claim 9, wherein the first majority charge carrier type is n-type, and wherein the second majority charge carrier type is p-type, and wherein the photodiode is disposed between the backside and the vertical overflow drain.

11. The image sensor pixel of claim 1, wherein a first portion of the semiconductor material is laterally disposed between the vertical overflow drain and the vertical transfer transistor.

12. The image sensor pixel of claim 1, wherein the vertical overflow drain is coupled to ground or a variable voltage source.

13. An image sensor system, comprising:
    a plurality of pixels disposed in a semiconductor material positioned to receive light through a backside of the image sensor and generate image charge, wherein each pixel in the plurality of pixels includes:
      a photodiode disposed in the semiconductor material;
      a pinning layer disposed in the semiconducting material and coupled to the photodiode;
      a vertical overflow drain disposed in the semiconductor material between a front side of the semiconductor material and the pinning layer, wherein the vertical overflow drain is in contact with the pinning layer and coupled to the pinning layer such that the pinning layer is disposed between the vertical overflow drain and the photodiode;
      a floating diffusion disposed in the semiconductor material proximate to the photodiode;
      a vertical transfer transistor disposed in part in the semiconductor material and coupled to the photodiode to transfer the image charge from the photodiode to the floating diffusion in response to a transfer signal applied to a gate terminal of the vertical transfer transistor;
    readout circuitry coupled to the plurality of pixels to readout the image charge from the plurality of pixels;
    control circuitry coupled to the plurality of pixels to control operation of the plurality of pixels; and
    wherein first lateral bounds of the vertical overflow drain is less than second lateral bounds of the pinning layer to separate the photodiode from the vertical overflow drain.

14. The image sensor system of claim 13, further comprising:
    a reset transistor coupled to the floating diffusion to reset the image charge in the floating diffusion; and a source follower transistor coupled to the floating diffusion to amplify the image charge on the floating diffusion for readout with the readout circuitry.

15. The image sensor system of claim 14, further comprising function logic coupled to receive image data readout from the readout circuitry, and wherein the function logic is coupled to alter the image data.

16. The image sensor system of claim 11, further comprising a gate oxide disposed on a frontside, opposite the backside, of the semiconductor material, and extending into the semiconductor material so that the gate oxide is disposed between the semiconductor material and a portion of the vertical transfer transistor that extends into the semiconductor material.

17. The image sensor system of claim 16, wherein the vertical transfer transistor extends into the frontside of the semiconductor material.

18. The image sensor system of claim 17, further comprising a shallow trench isolation structure extending into the frontside of the semiconductor material and surrounding the photodiode at least in part.

19. The image sensor system of claim 18, wherein the shallow trench isolation structure includes a trench in the semiconductor material filled with an oxide.

20. The image sensor system of claim 18, further comprising a deep isolation well extending from the shallow trench isolation structure to the backside of the semiconductor material.

21. The image sensor system of claim 20, wherein the deep isolation well includes a doped region of the semiconductor material.

22. The image sensor system of claim 11, wherein the gate terminal of the vertical transfer transistor is substantially "T"-shaped.

* * * * *